United States Patent [19]

Rogers

[11] Patent Number: 5,179,340

[45] Date of Patent: Jan. 12, 1993

[54] APPARATUS FOR MONITORING THE STATE OF CHARGE OF A BATTERY

[75] Inventor: Wesley A. Rogers, Grosse Pointe Park, Mich.

[73] Assignee: Electronic Development Incorporated, Grosse Pointe Park, Mich.

[21] Appl. No.: 607,237

[22] Filed: Oct. 31, 1990

Related U.S. Application Data

[63] Continuation-in-part of Ser. No. 218,539, Jul. 13, 1988, Pat. No. 4,968,941.

[51] Int. Cl.$^5$ .......................................... G01N 27/416
[52] U.S. Cl. ................................... 324/428; 324/426
[58] Field of Search ............... 324/426, 427, 428, 435; 340/636; 320/48

[56] References Cited

U.S. PATENT DOCUMENTS

| | | | |
|---|---|---|---|
| 3,484,681 | 12/1969 | Grady, Jr et al. | 324/428 |
| 3,727,074 | 4/1973 | Keller et al. | 324/428 X |
| 3,805,157 | 4/1974 | Acks et al. | 324/428 X |
| 4,204,162 | 5/1980 | Froidevaux | 324/427 X |
| 4,377,787 | 3/1983 | Kikuoka et al. | 324/431 |
| 4,679,000 | 7/1987 | Clark | 324/428 |

Primary Examiner—Jack B. Harvey
Attorney, Agent, or Firm—Davis Hoxie Faithfull & Hapgood

[57] ABSTRACT

An apparatus for monitoring the state of charge of a battery having a shunt resistor connected in series with a battery and an integrating circuit connected across the terminals of the shunt resistor. The integrating circuit includes a memoriode having a large capacitance and the capability to store charge for long periods of time, so that the integration can be performed along the same curve even if power to the integrating circuit is interrupted.

34 Claims, 3 Drawing Sheets

APPARATUS FOR MONITORING THE STATE OF CHARGE OF A BATTERY

This is a continuation-in-part of copending application Ser. No. 07/218,539 filed on Jul. 13, 1988, now U.S. Pat. No. 4,968,941.

FIELD OF THE INVENTION

This invention relates to apparatus to monitor the state of charge in a battery. More specifically, it relates to apparatus that tracks current flow in and out of a battery by integrating the voltage drop across a shunt resistor, and stores the net result as an indication of the state of charge.

BACKGROUND OF THE INVENTION

One method of measuring the state of charge of a battery is to test the specific gravity of the electrolyte in each cell of the battery. When the battery is fully charged, the electrolyte will have a specific gravity of about 1.25 to 1.29, meaning the electrolyte will weigh 1.25 to 1.29 times as much as the same volume of pure water. A battery that is less than fully charged will have a correspondingly lower specific gravity.

This test is performed with a hydrometer which has a small float in a glass barrel and a rubber bulb at the top of the barrel. The bulb must be squeezed and released to draw some of the electrolyte into the barrel and the level of the float in the barrel measured to determine the specific gravity. This test, therefore, is capable of determining the state of charge of a battery whose cells are accessible and which is not in use. Many of today's batteries, however, are sealed tight and their cells are not accessible. Furthermore, there are many instances where this test is inconvenient to perform. For example, where a large bank of batteries is used, it is not practical to measure the specific gravity of each cell in every battery. Also when an automobile is in use, for example, in a traffic jam, it is not practical to determine the battery state of charge with a hydrometer.

An attempt to overcome the inconvenience associated with testing the specific gravity with a hydrometer resulted in the installation of a hydrometer in a single cell of various automotive batteries to measure the specific gravity of that cell. If that cell has sufficient charge, then a green dot appears at the top of the battery. Automotive batteries, however, have six cells and the total output of such a battery is the average of all six cells. This device is, therefore, capable of monitoring the state of charge of only a single cell in a battery which may not be indicative of the overall charge stored in a battery.

Voltmeters and ammeters have been used to measure the output from a battery, however, each of these meters only measures the instantaneous voltage or current, respectively. They are not able to integrate the result and, therefore, can not indicate the charge stored in a battery, unless these meters are monitored every instant.

A current counter which continuously registers the net current from an automotive battery is disclosed in the ELV Journal No. 45, dated May/June 1986. This device measures the voltage drop across a precision shunt resistor, which is in series with the monitored battery. The voltage is amplified and drives a voltage to frequency converter, the output of which is fed into an up/down counter. The counter counts up or down while the battery is discharging or being charged, respectively. The output of the counter drives an integrated display.

The display is initialized when the current counter is first connected to a fully charged battery and from there on indicates the net current flow from the battery. For continuous monitoring, however, the circuitry leading to the up/down counter must be continuously energized by a power source, such as the battery, since there is no way for the ELV current counter to remember the net current from a battery if it loses power.

OBJECTS AND SUMMARY OF THE INVENTION

It is therefore an object of the present invention to monitor the state of charge of a battery or other energy storage devices.

It is a further object to integrate the voltage across a shunt resistor which is representative of the net current from a battery or other energy storage devices.

It is a further object to maintain a monitored state of charge while the monitoring apparatus is temporarily disconnected from a battery or other energy storage devices.

It is a further object to be able to sense current flow through the shunt resistor and selectively energize a circuit for integrating the voltage across the shunt resistor during discharge and charge currents.

In accordance with the invention there is provided apparatus for monitoring the state of charge of a battery. The apparatus includes a shunt resistor and an integrating circuit whose inputs are connected across the terminals of the shunt resistor. The voltage drop across the shunt resistor, which is related to the current flow from the battery by Ohm's Law, is integrated over time by the integrating circuit.

The integrating circuit includes an operational amplifier, a resistor in one of the input paths of the operational amplifier and a device having a large capacitance in the feedback path. A device which is particularly useful in this application is a Memoriode, which has a large capacitance and once charged is capable of storing that charge for a long period of time.

During the monitoring of the state of charge of a battery, the integrating circuit integrates the voltage across the shunt resistor, so that the Memoriode is charged or discharged to a voltage level which follows an integration curve of the shunt resistor voltage over time. If necessary or desired, the battery can be disconnected from the integrating circuit when the battery is not being charged or discharged and the Memoriode will store the last voltage on the integration curve for up to three years. When the battery is reconnected, the integrating circuit and the integration of the voltage across the shunt resistor will start at the same point on the integration curve.

The integrating circuit output drives a voltage follower whose output is amplified to drive a display. The display comprises an analog meter or a digital display with green, yellow and red light emitting diodes (LED), wherein the lit LED denotes the battery state of charge.

A voltage limiter circuit senses the voltage across the Memoriode, so that the maximum voltage rating of the Memoriode is not exceeded. The output voltage of the integrator circuit is sensed and the terminals of the Memoriode are shorted when that rating is exceeded to prevent further charging of the Memoriode.

Circuits which sense charging and discharging currents from the battery and the resulting voltage drop across the shunt resistor are also provided. The outputs of these circuits activate the integrating circuit during the charging and discharging currents and disable the integrating circuit at other times.

A circuit to sense currents which are much higher than normal discharge currents, such as those developed when turning a starter motor, is provided. This circuit causes a small resistor to be placed across the Memoriode terminals for the duration of the high discharge currents, which significantly shortens the time constant of the integrating circuit, so that the voltage across the Memoriode terminals can be quickly discharged at a rate corresponding to the rapid discharge of the battery.

DESCRIPTION OF THE PREFERRED EMBODIMENT

Figure 1:
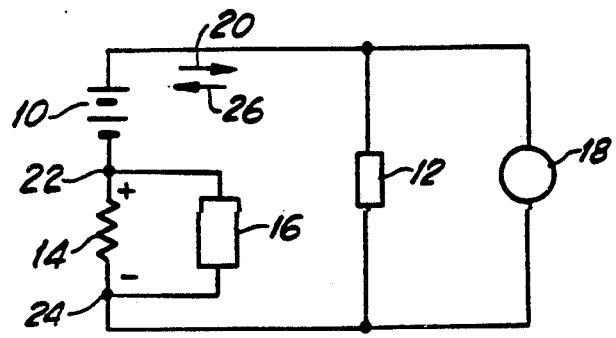
FIG. 1 illustrates a Battery State of Charge Monitor connected across a shunt resistor in a circuit.

Referring to FIG. 1 of the drawings, a Battery State of Charge (BSOC) Monitor 16 is illustrated in a circuit with a battery 10, such as a 12 volt automotive battery or any other energy storage device, which supplies power to a load 12, such as a starter motor or accessory circuits in an automobile, and which can be charged by an alternator/battery charger 18. A shunt resistor 14 is in series with the battery 10 and the load 12. The input terminals of the BSOC Monitor 16 are connected to the terminals 22 and 24 of the shunt resistor 14.

The voltage drop across the shunt resistor 14 is related to the current flowing through the battery 10 by Ohm's Law. The current can be in either direction indicated by arrows 20 and 26, depending on whether the battery 10 is discharging current to the load 12 or being charged by the alternator/battery charger 18, respectively.

The BSOC Monitor 16 integrates the voltage drop over time, thereby providing an accurate measure of the net current to or from the battery 10 and the corresponding state of charge of the battery 10. The BSOC Monitor 16, therefore, tracks energy into and out of the battery 10 by acting as a model of the battery 10.

Figure 2:
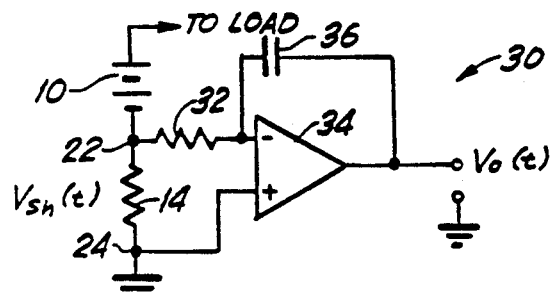
FIG. 2 is a schematic of an embodiment of an integrating circuit using a Memoriode as a high capacitance device.

FIG. 2 shows one embodiment of an integrating circuit 30, in accordance with the invention having a resistor 32 connected in series with an input voltage, $V_{sh}$, and the non-inverting input of an operational amplifier 34 and a device 36, having a large capacitance, in the feedback path. The large capacitance device 36 is preferably a Memoriode, for example, product number MD-50E2, manufactured by Sanyo Electric Co., Ltd., which is capable of storing a charge for up to three years. The output of this circuit, $V_o(t)$, is as follows:

$$V_o(t) = -(1/RC)\int_0^t V_{sh}(t)dt + c \quad \text{(Eq. 1)}$$

where $V_{sh}(t)$ is the voltage drop across the shunt resistor and c is a constant of integration which equals the initial charge on the Memoriode 36.

Figure 3:
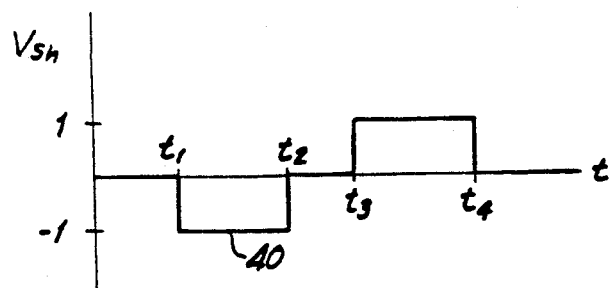
FIG. 3 is a graph of a voltage drop across the shunt resistor versus time which is due to the net current flow from the battery and is input to an integrating circuit.
Figure 4:
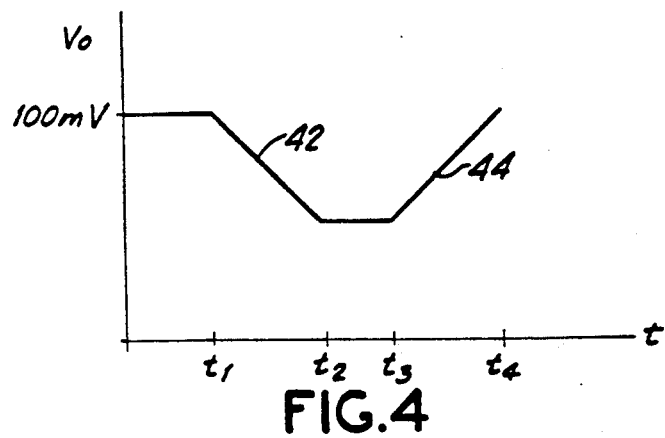
FIG. 4 is a graph of the integrating circuit output voltage versus time which results from the corresponding input voltage shown in FIG. 3.

FIGS. 3 and 4 show an exemplary input voltage curve, $V_{sh}(t)$, and the corresponding output of the integration circuit, $V_o(t)$. Assume that the battery is fully charged and that there is no current flow until time $t_1$. At time $t_1$, the battery begins supplying or discharging current to a load 12 in the direction indicated by arrow 20 (FIG. 1). The current discharged is a step function and the corresponding voltage drop, $V_{sh}(t)$, across the terminals 22 and 24 of the shunt resistor 14 is a negative step function, as shown by region 40 between $t_1$ and $t_2$. The output voltage of the integrator, $V_o(t)$, during region 40 is therefore:

$$V_o(t) = -(1/RC)\int_{t_1}^t U(t)dt + c = -(1/RC)(t - t_1) + c \quad \text{(Eq. 2)}$$

where c=100 mV and U(t) is the voltage drop across the shunt resistor 14. The integration curve, $V_o(t)$ therefore, follows a ramp 42 between $t_1$ and $t_2$.

At $t_2$ the battery stops supplying current to the load 12, so that no current flows through the shunt resistor 14. The voltage across the shunt resistor, $V_{sh}(t)$, therefore, equals zero from $t_2$ and $t_3$. The integration curve, $V_o(t)$ of FIG. 4, therefore, stays at the level $-(1/RC)(t_2-t_1)+c$, until $t_3$.

At time $t_3$, the alternator or battery charger 18 begins to charge or supply current to the battery 10. The current supplied is a step function from time $t_3$ until $t_4$. The integration curve, $V_o(t)$, tracks the corresponding voltage drop across the shunt resistor, $V_{sh}(t)$. In the case of charging the battery 10, the current flows in the direction indicated by arrow 26 (FIG. 1) and the voltage drop across shunt resistor 14 is in the opposite polarity from when the battery is discharging current. The resulting output voltage from the integrating circuit, $V_o(t)$, is a ramp 44 and equals zero again at time $t_4$.

The integration curve $V_o(t)$, of FIG. 4 is maintained by the BSOC Monitor 16 by the use of the Memoriode 36. The Memoriode is a device having a very high capacitance, typically 1.8 Farads, which is based on a transfer of electrons, it can store charges for long periods of time. For this reason, the battery can be disconnected from the integrating circuit, if necessary, during the time between intervals $t_0$ to $t_1$ and $t_2$ to $t_3$, when no net current is flowing from the battery 10. In this event, even though the power is removed, the Memoriode 36 will have charged to a corresponding level on the integration curve, $V_o(t)$, and it will store that value for up to three years. The battery 10 can therefore be stored or can sit idle for up to three years and when used again, the BSOC Monitor 16 will begin integrating along the integration curve $V_o(t)$, at the same point as when the battery 10 was stored, thus maintaining an accurate account of the net current flow from the battery 10.

Since large current swings occur with the use of automotive batteries and the like (on the order of 0–200 amperes during rapid charging and discharging of automotive batteries, for example) shunt 14 must be small enough to produce a voltage drop low enough to be within the operating range of operational amplifier 34, typically on the order of 1 millivolt per ampere. As a result, however, the relatively small charge or discharge currents occasioned during low charge and discharge periods, such as when the automobile is idling, will produce a very small voltage across the shunt 14, such as, for example, on the order of 0.5 to 1.0 millivolt. It has therefore been found that a desirable characteristic of operational amplifier 34 is its ability to track relatively small voltage swings. An operational amplifier that has been found to operate particularly well in tracking such small voltages, in the single-ended mode, is the RCA CA3140AE.

Figure 5:
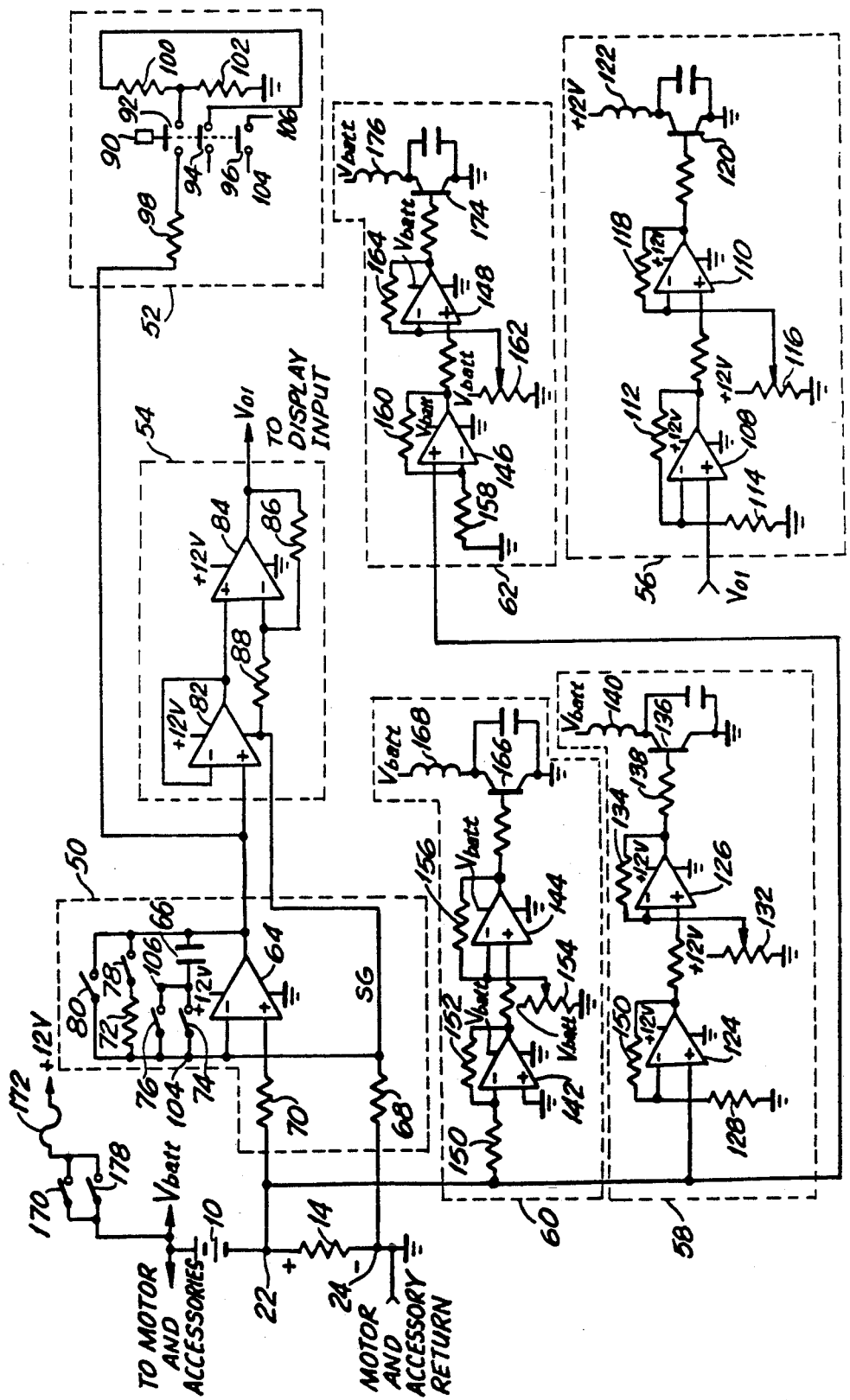
FIG. 5 is a schematic diagram of a Battery State of Charge Monitor in accordance with a preferred embodiment of the invention.

Referring to FIG. 5 of the drawings, a more detailed schematic diagram of the BSOC monitor 16 is illustrated. It includes an integrating circuit 50, an initializing circuit 52, a display driver circuit 54, a Memoriode voltage limiting circuit 56, a high current sensing circuit 58, a discharge current sensing circuit 60 and a circuit 62 for sensing charging currents.

The integrating circuit 30 of the BSOC monitor 16 preferably comprises an operational amplifier 64, a 1.6 kohm resistor 66 and a Memoriode 68 as well as switches 74, 76, 78 and 80 and resistor 72 which are controlled by the above circuits, the functions of which will be described below. The inputs of the amplifier 64 are connected to the terminals 22 and 24 of the shunt resistor 14 through resistors 70 and 66, respectively. A resistor 70, with the same value as resistor 66, is provided to balance the input lines to amplifier 64 so as to minimize the amplifier offset voltage. The non-inventing input of the amplifier 64 is further connected to the ground pin of amplifier 82 and resistor 88 in the display driver circuit 54 by wire SG to avoid a condition wherein a step function input to amplifier 64 causes a corresponding step in the display. As previously discussed, the voltage across the terminals 22 and 24 of the shunt resistor 14 is related to the current through the battery 10, so that the integrator circuit input is determined by the charging or discharge current to or from the battery 10, and the output, $V_o(t)$, represents the net current flow. The BSOC Monitor 16, therefore, provides an accurate indication of a battery's state of charge by tracking the current to and from a battery or the other energy storage device over time.

The components of the integrating circuit 50 and the shunt resistor 14 are selected to allow the integrating circuit 50 to follow the discharge curve of a given battery 10. For example, if a shunt resistance of 1 mV/Amp is selected for use with an 80 Amp-Hour battery having a 1 Amp discharge rate and a Memoriode 66 has a voltage range from 0 to 100 mV and a capacitance of 1.8 Farads, then for the integrating circuit 60 to linearly track the battery discharge, resistor 66 must be selected to satisfy the following equation:

$$V_o = V_{sh}(t/RC) \qquad (Eq. 3)$$

where $V_o$ equals the maximum output of the integrator (i.e., 100 mV), $V_{sh}$ equals the voltage across the resistor 14 (i.e., 1 mV for a 1 Amp discharge current), t equals the discharge time for an 80 Amp-Hour battery discharging 1 Amp (i.e., 288,000 seconds), R is the resistance of resistor 66 and C is the capacitance of the Memoriode 66 (i.e., 1.8 Farads). R, therefore, equals 1.6 kohms. Different value resistors 66 can be selected for batteries with different Amp-Hour ratings according to the time, t, for discharging, or a switch can be provided to select the appropriate resistor. Once the proper resistor 66 is selected, the integrator will track the discharge path of a battery 10 regardless of the discharge rate.

The integrator output, $V_o(t)$, drives a display driving circuit 54, which includes operational amplifiers 82 and 84. Operational amplifier 82 is connected in a voltage follower mode with its output connected to its non-inverting input to provide impedance isolation. Operational amplifier 84 has resistors 86 and 88 in its feedback path, preferably selected to provide the amplifier stage with a gain of about ten so as to drive a display unit. The display unit, not shown, can be an analog ammeter or a digital display consisting of an integrated circuit bar graph display having a green, yellow and red LEDs with the green indicating a satisfactory state of charge, the yellow a unsatisfactory charge and a red a dead battery. To implement the digital display, an analog to digital converter would be connected to the output of the display driving circuit 54 to convert the analog signal to a digital signal.

The initializing circuit 52 is provided to initially charge the Memoriode 66 to a voltage which is related to the state of charge in the battery 10. When the BSOC Monitor 16 inputs are initially connected across the shunt resistor 14 to a fully charged battery 10, the charge button 90 is depressed until the display indicates a full state of charge. If the digital LED display is used, the button 60 should be held until the green light appears.

The BSOC Monitor 16 may also be connected to a partially charged battery which is not sealed. In this case, the battery electrolyte is sampled to determine its specific gravity. A chart that correlates the specific gravity with the state of charge of the battery is provided. The button 72 is operated until the display indicates the appropriate charge.

The charge button 90 activates three single pole single throw (SPST) switches 92, 94 and 96 when depressed. When closed, switch 92 charges the Memoriode 66 to 100 mV through resistor 98 with a voltage developed by a voltage divider consisting of resistors 100 and 102. The rate of charge is slow enough so that the operator can observe either the red, yellow and green diodes light in sequence or the analog meter as the Memoriode voltage increases to 100 mV. Switch 94, when closed, supplies battery voltage, $V_{batt}$, to the voltage divider 100 and 102 so as to supply current through switch 92 to charge the Memoriode 36. When depressed, the button 60 also closes SPST switch 96, so as to short terminals 104 and 106, thereby bypassing the open switches 74 and 76, and providing a current path to charge the Memoriode 66.

The voltage limiter circuit 56 limits the voltage across the Memoriode 66 to less than the maximum voltage rating of the Memoriode 66, thereby preventing the Memoriode 36 from being damaged. Circuit 56 preferably senses the output, $V_{o1}$, of the display driver circuit 54, although it can also sense the output of the voltage follower 82 or the integrating circuit output. The gains of amplifiers 108 and 110 are selected by the values of resistors 112, 114, 116 and 118 so that when $V_{o1}$ reaches a voltage level corresponding to the maximum voltage across the Memoriode 66, the amplifier 110 drives the transistor 120 so that current flows through coil 122, causing switch 80 to close so that the terminals of the Memoriode 36 are short circuited, thereby preventing further changing of the Memoriode 36.

During operation, therefore, the Memoriode 66 is initially charged to its maximum rated voltage by circuit 52, so that the charge on the Memoriode 66 corresponds to the state of charge of the battery 10. Circuit 56 then limits the Memoriode voltage to a value less than the maximum rating, so that if a fully charged battery 10 is further charged, the BSOC monitor 16 will not indicate an increased state of charge on the battery 10. This corresponds to the true state of charge since battery charge is not increased by overcharging. Circuit 56, therefore, modifies equation 1 which specifies the output of an integrating circuit by limiting $V_o(t)$ to a maximum of 100 mV.

The circuit 58 senses when high currents are discharged from the battery 10, as in the case of turning a starter motor on an automobile. The gains of operational amplifiers 124 and 126 are adjusted by selecting appropriate values for resistors 128, 130, 132 and 134 and then adjusting resistor 132 so that the output of operational amplifier 126 drives transistor 136 only when discharge currents of 100 A are reached. In cases where currents lower than 100 A are to be sensed, the values of the resistors can be selected so that operational amplifier 126 drives the transistor 136 at those lower currents.

When the high discharge current is sensed operational amplifier 126 drives the transistor 136 through resistor 138 so that current flows through the coil 140 of a relay, closing switch 78. The closing of switch 78 places a resistor 72 across the Memoriode 66 for the duration of the high current. This resistor 72 significantly shortens the time constant of the integrating circuit 50, allowing a rapid discharge of the Memoriode 66 to correspond to the rapid discharge of the battery by the high discharge current, so that the integrating circuit 50 accurately tracks the battery state of charge.

The discharge turn on circuit 60 and the battery charge turn on circuit 62 provide automatic application of power to the integrating circuit 50 as well as other circuits in the BSOC Monitor 16. Operational amplifiers 142, 144, 146 and 148 are powered directly from the battery voltage, $V_{batt}$, so that they constantly monitor the voltage across the shunt resistor 14. The input to amplifier 142 is connected to the inverting input and the resistors 150, 152, 154 and 156 are selected such that the gains of amplifiers 142 and 144 that are sufficient to provide an output of amplifier 106 is high only when a discharge current of 1 Amp is sensed. Similarly, the amplifier 108 is connected in the non-inverting mode and the gains of amplifiers 108 and 110 are selected so that the output of amplifier 110 is high only when a charging current of 1 Amp is detected. Both of these circuits 60 and 62 can have the resistors selected so the threshold of detection of discharge or charging currents, respectively, can be lowered or raised as appropriate to the application.

In the case of the discharge current sensing circuit 60, the amplifier 144 drives the transistor 166 when discharge currents are sensed, causing current to flow through the coil 168 of a relay, thereby closing switches 74 and 170. Switch 170 supplies power from the battery 10 through fuse 172 to the integrating circuit 50 and other BSOC Monitor circuits. Switch 74 provides a discharge path for the Memoriode 66 so that the integrating circuit 50 can track the dischage of current from the battery 10.

In the case of the charging current sensing circuit 62, the amplifier 148 drives the transistor 174 when charging currents are sensed, causing current to flow through the coil 176 of a relay, thereby closing switches 76 and 178. The closing of switch 178 supplies power to the BSOC Monitor circuits and switch 76 provides a charging path for the Memoriode 66.

Thus, the Memoriode 66 is open circuited except when it is being initialized by the depression of push button 90 or a charging or discharging current is flowing. When none of these conditions exist, there is no need for the circuit to the Memoriode to be closed, and by opening the circuit, there is no discharge path for it, and it will retain its most recent charge for years.

These circuits 60 and 62 create approximately a 2 mA current drain from the battery 10, since the amplifiers 142, 144, 146 and 148 obtain power directly from the battery 10. If the application is appropriate, for example, in the case of an automotive battery, an on/off switch can be provided instead of the automatic sensing circuits 62 and 64.

If the threshold of the discharge sensing circuit 60 is high enough, self discharge currents from the battery 10, typically less than 10 mA, are not sensed. To account for this, a very high resistor, typically 100 kohms, can be connected across the Memoriode 66 to simulate battery self discharge currents.

Figure 6:
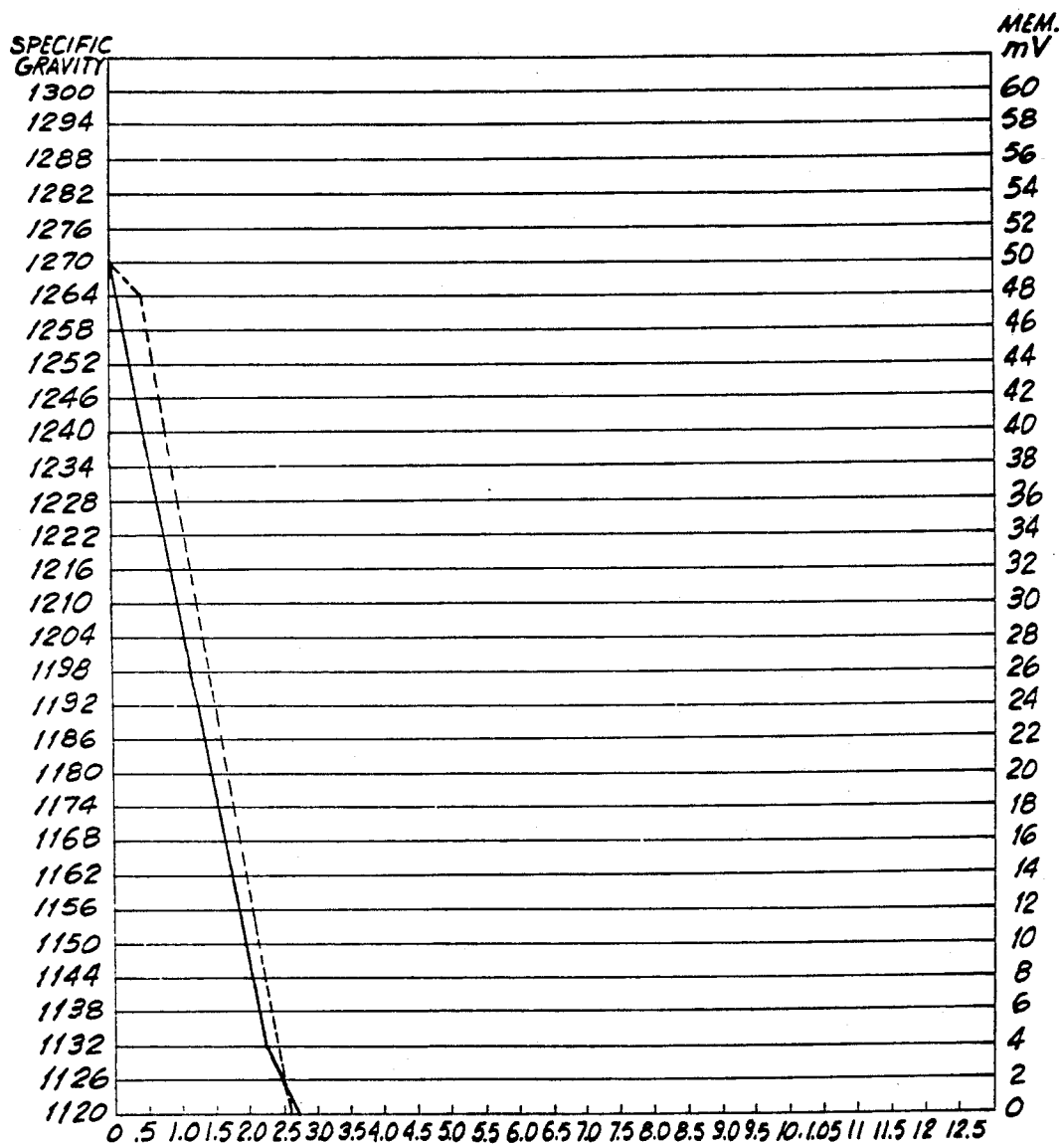
FIG. 6 illustrates a battery discharge electrolyte curve and the associated battery state of charge as monitored by the Battery State of Charge Monitor in accordance with the invention.

FIG. 6 of the drawing illustrates the integrating circuit 50 output (solid line referenced to the right hand vertical scale) and the electrolyte curve (dashed line referenced to the left hand vertical scale in specific gravity) of a discharging battery. It can be seen that the BSOC Monitor 16 tracks the electrolyte curve to within 1% accuracy.

I claim:

1. An apparatus for monitoring the state of an electrical energy source comprising:
    a current sensor operatively connected to the energy source for producing an output signal related to the magnitude and direction of the current flowing to or from said energy source;
    an electrical long term analog integrator connected to said current sensor for integrating said output signal and for producing a signal related to the state of the energy source;
    said integrator including a long term charge storage device for storing a charge related to the state of the energy source;
    said integrator charging at a rate proportional to the magnitude of the sensed current when the current flow is in one direction, and discharging at a rate proportional to the magnitude of the sensed current when the current flow is in the opposite direction;
    said long term charge storage device being nonvolatile in its charge retention when unconnected to a discharge circuit; and
    conductors and an active circuit element responsive to the current sensed by the current sensor for automatically opening the circuit to the storage device when no current is flowing to or from the energy source.

2. The apparatus of claim 1 wherein said integrator includes an operational amplifier capable of tracking small voltage swings, on the order of approximately 0.5 to 1 millivolt.

3. The apparatus of claim 2 wherein said operational amplifier operates in the single-ended mode.

4. The apparatus of claim 1 wherein said current sensor produces a voltage drop on the order of approximately 1 millivolt per amp.

5. An apparatus for monitoring the state of an electrical energy source comprising:
a current sensor operatively connected to the energy source for producing an output signal related to the magnitude and direction of the current flowing to or from said energy source;
a capacitive element having a capacity of more than one farad connected to said current sensor for integrating said output signal and for producing a signal related to the state of the energy source;
said capacitive element charging at a rate proportional to the magnitude of the sensed current when the current flow is in one direction, and discharging at a rate proportional to the magnitude of the sensed current when the current flow is in the opposite direction, on a continuous basis as the current flows to and from said energy source.

6. Apparatus as in claim 5 wherein the capacitive element is a Memoriode.

7. Apparatus as in claim 5, further including:
an amplifier connected between the current sensor and the capacitive element.

8. Apparatus as in claim 7 wherein the amplifier is an operational amplifier having two input terminals and an output terminal; and
the capacitive element is connected in a feedback circuit between the output terminal and one of the input terminals.

9. The apparatus of claim 8 wherein said operational amplifier operates in the single-ended mode.

10. The apparatus of claim 9 wherein said operational amplifier is capable of tracking small voltage swings, on the order of approximately 0.5 to 1 millivolt.

11. Apparatus as in claim 5, further including:
a discharge control circuit responsive to the current sensor for discharging the capacitive element when the current flowing from the energy source reaches a predetermined level.

12. Apparatus as in claim 11 for monitoring the state of charge of a battery, further including:
a resistive element; and
means for selectively connecting the resistive element to the capacitive element;
the discharge control circuit operating to connect the resistive element to the capacitive element when the current from the energy source reaches a predetermined level, so as to discharge the capacitive element at a discharge rate that corresponds to the discharge rate of the battery during the time the current remains at or above the predetermined level.

13. Apparatus as in claim 5, further including:
a second discharge control circuit responsive to the voltage across the capacitive element for rapidly discharging the capacitive element when the voltage reaches a predetermined level.

14. Apparatus as in claim 13, further including:
a low resistance element;
the second discharge control circuit operating to connect the low discharge element to the capacitive element to rapidly charge the capacitive element when the voltage reaches a predetermined level, until such time as it falls below that level.

15. The apparatus of claim 5 wherein said current sensor produces a voltage drop on the order of approximately 1 millivolt per amp.

16. A method of monitoring the state of an electrical energy source comprising the steps of:
sensing the direction and amount of current flow into and out of the energy source;
integrating the net amount of said current flow continuously as current flows into and out of said energy source;
the step of integrating comprising charging a capacitive element having an effective capacity of more than one farad in response to current flow in one direction, at a charge rate that is in proportion to the amount of current flow, and discharging the capacitive element in response to current flow in the opposite direction at a discharge rate that is in proportion to the amount of current flow.

17. The method of claim 16 wherein the step of integrating comprises charging and discharging a Memoriode.

18. The method in claim 16, including the further step of discharging the capacitive element by a separate discharge circuit, at a predetermined discharge rate, when the current flow from the energy source is higher than a predetermined amount.

19. The method of claim 17 wherein the step of discharging the capacitive element at a predetermined discharge rate comprises automatically connecting a resistor of predetermined value across the capacitive element.

20. The method of claim 16, including the further steps of:
sensing a voltage that is proportional to the voltage across the capacitive element; and
inhibiting any further increase of voltage across said capacitive element when the sensed voltage reaches a predetermined level.

21. The method of claim 20 wherein the step of inhibiting comprises applying a low resistance current flow path to the capacitive element when the sensed voltage reaches a predetermined level.

22. The method of claim 16, including the further step of disconnecting the capacitive element from any charging or discharging circuit when no current flow into or out of the energy source is sensed.

23. The method of claim 16 wherein said step of sensing the amount of current flow comprises the step of producing a voltage across a shunt on the order of approximately 1 millivolt per amp.

24. A method of monitoring the state of charge of a battery comprising the steps of:
sensing the current flow to and from the battery;
automatically charging and discharging a capacitive element in a long time constant circuit in response to, and in proportion to, the magnitude and direction of the sensed current flow, so that the charge across the capacitive element is continually proportional to the charge of the battery;
compensating for any current flow from the battery that reaches a sufficiently high level by discharging the capacitive element at a predetermined rate during the period of time that the high current flow level continues.

25. The method of claim 24 wherein the step of integrating comprises the step of applying said voltage to the inputs of an operational amplifier capable of tracking small voltage swings, on the order of approximately 0.5 to 1 millivolt.

26. The method of claim 25 wherein said step of integrating includes the step of operating said operational amplifier in the single-ended mode.

27. The method of claim 25 wherein the step of automatically charging and discharging comprises automatically charging and discharging a Memoriode.

28. The method of claim 25 wherein the step of compensating comprises sensing the current flow from the battery, and when it reaches a sufficient level, automatically applying a discharge circuit across the capacitive element.

29. The method of claim 25 wherein the step of compensating comprises automatically connecting to the capacitive element a discharge circuit that provides a predetermined discharge time constant for the capacitive element to discharge it at a rate that simulates the discharge of the battery during the high current flow.

30. A method of monitoring the state of an electrical energy source comprising the steps of:
   initializing a capacitive element having an effective capacity of one farad or more by charging it corresponding to the state of the energy source;
   sensing the current flow to and from the energy source and automatically increasing and decreasing the charge on the capacitive element in proportion to the current flow to and from the energy source, for the entire periods of time that the current is flowing to and from the source; and
   automatically discharging the capacitive element at a predetermined discharge rate when the current flow out of the source reaches a predetermined value, for as long as the current flow remains at or above the predetermined value.

31. The method of claim 30, including the further step of:
   automatically discharging the capacitive element at a predetermined rapid discharge rate if the voltage across it reaches a predetermined value, until such time as the voltage across it falls below that value.

32. A method as in claim 31 wherein the step automatically discharging the capacitive element at a predetermined rapid rate comprises sensing a voltage that is proportional to the voltage across the capacitive element and applying a low resistance discharge path across the capacitive element when the voltage reaches the predetermined value, until such time as the voltage falls below the predetermined value.

33. The method of claim 30 further including the step of:
   opening the circuit to the capacitive element so that the capacitive element cannot discharge, during the time that the current is not flowing.

34. The method of claim 30 wherein the initializing and charging and discharging steps further comprise initializing, discharging and charging a Memoriode.

* * * * *